US008598697B2

(12) United States Patent
Kirsch et al.

(10) Patent No.: US 8,598,697 B2
(45) Date of Patent: Dec. 3, 2013

(54) POWER SEMICONDUCTOR MODULE, METHOD FOR PRODUCING A POWER SEMICONDUCTOR MODULE AND A HOUSING ELEMENT FOR A POWER SEMICONDUCTOR MODULE

(75) Inventors: Olaf Kirsch, Erwitte (DE); Peter Kanschat, Soest (DE); Andre Roehrig, Kamen (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 131 days.

(21) Appl. No.: 13/192,323

(22) Filed: Jul. 27, 2011

(65) Prior Publication Data
US 2012/0025393 A1 Feb. 2, 2012

(51) Int. Cl.
*H01L 23/48* (2006.01)

(52) U.S. Cl.
USPC ............ 257/693; 257/E21.506; 257/690; 438/622

(58) Field of Classification Search
USPC ............ 257/E21.506, E21.575, E23.01, 690, 257/691, 693, 678, 718, 773; 438/121, 622; 439/266, 709; 361/730, 807, 810, 800
See application file for complete search history.

(56) References Cited

U.S. PATENT DOCUMENTS

| 5,920,119 | A | * | 7/1999 | Tamba et al. | 257/718 |
| 6,828,600 | B2 | * | 12/2004 | Lenniger et al. | 257/181 |
| 7,445,519 | B2 | * | 11/2008 | Matsumoto | 439/709 |
| 7,848,112 | B2 | * | 12/2010 | Matsumoto | 361/730 |
| 7,944,042 | B2 | * | 5/2011 | Yoshihara et al. | 257/693 |
| 2003/0168724 | A1 | | 9/2003 | Lenniger | |
| 2008/0001278 | A1 | * | 1/2008 | Matsumoto | 257/690 |
| 2008/0142948 | A1 | * | 6/2008 | Matsumoto | 257/690 |
| 2008/0217756 | A1 | | 9/2008 | Boettcher et al. | |
| 2009/0212411 | A1 | * | 8/2009 | Matsumoto et al. | 257/690 |

FOREIGN PATENT DOCUMENTS

DE 102010000942 A1 7/2011
FR 2 660 826 A1 10/1991

* cited by examiner

*Primary Examiner* — Chris Chu
(74) *Attorney, Agent, or Firm* — Murphy, Bilak & Homiller, PLLC (57) ABSTRACT

A power semiconductor module includes a housing element into which one or more connecting lugs are inserted. Each connecting lug has a foot region on the topside of which one or more bonding connections can be produced. In order to fix the foot regions, press-on elements are provided, which press against the end of the connecting lug.

8 Claims, 9 Drawing Sheets

POWER SEMICONDUCTOR MODULE,
METHOD FOR PRODUCING A POWER
SEMICONDUCTOR MODULE AND A
HOUSING ELEMENT FOR A POWER
SEMICONDUCTOR MODULE

PRIORITY CLAIM

This application claims priority to German Patent Application No. 10 2010 038 727.4 filed on 30 Jul. 2010, the content of said application incorporated herein by reference in its entirety.

TECHNICAL FIELD

The present application relates to power semiconductor modules.

BACKGROUND

Power semiconductor modules have electrical connecting contacts for the electrical connection of module-external components, the contacts being accessible from the exterior of the module and being electrically conductively connected to one or more power semiconductor chips or other components arranged in the interior of the module. In this case, the electrical connection is realized by low-resistance electrical conductors, which are designated as connecting lugs hereinafter.

In this case, there is the requirement that such connecting lugs can be connected to the housing in the simplest possible manner, and that a connection arises which is sufficiently stable so that a force acting on that part of the connecting lug which is situated outside the housing is not transmitted to other, in particular module-internal, components in an impermissible manner.

Besides stable fixing, it is additionally necessary to ensure that the connecting lugs assume a defined position in the housing if the connecting lugs are connected module-internally to electronic components of the module by bonding wires in order that a high, reproducible bonding quality can be ensured during the production of a bonding connection between a bonding wire and a connecting lug. These requirements are particularly stringent in the case of thick copper-based bonding wires having diameters of 300 μm or more, since copper-based bonding wires are significantly harder than the aluminum-based bonding wires usually used, such that the bonding process requires significantly higher forces with which the bonding wire is pressed against the connecting lug during the bonding operation.

A further aspect concerns, for example, the mounting of a module cover on a housing frame pre-equipped with the connecting lugs, and the mounting of the finished module on a printed circuit board. These steps require a high degree of dimensional and positional stability and also a high positional accuracy of the connecting contacts formed on the connecting lugs. If the contacts are embodied as plugs, for example, it is possible, in the case of imprecise positioning and orientation, that instances of tilting occur, or that the plugs cannot be threaded through corresponding holes in the printed circuit board. In order to meet these requirements, a high mechanical outlay is currently expended in order to wedge the plugs during mounting in the frame. This has the effect that the position and location of the plugs in the frame can vary. Therefore, it is entirely customary to realign the plugs in the housing frame.

SUMMARY

According to an embodiment of a power semiconductor module, one or a plurality of connecting lugs are connected to a housing element for a power semiconductor module so fixedly that even a copper-based bonding wire can be reliably bonded to the connecting lug, and that subsequent orientation of the module-external contacts formed on the connecting lugs can be obviated. Further embodiments include providing a method for mounting a connecting lug in a housing element for a power semiconductor module and a method for producing a power semiconductor module which includes a connecting lug wherein one or a plurality of connecting lugs are connected to a housing element for a power semiconductor module so fixedly that even a copper-based bonding wire can be reliably bonded to the connecting lug.

The power semiconductor module described below has a housing element having an insertion channel, and also an electrically conductive connecting lug inserted into the insertion channel.

The connecting lug includes an elongated shaft and a foot region, which extends as far as a first end of the connecting lug, the first end facing the module interior. The foot region, having an underside and a topside facing away from the underside, is bent over relative to the shaft by a predefined bending angle.

Furthermore, the housing element has at least one press-on element assigned to the connecting lug, wherein the foot region is clamped in the housing element by virtue of each press-on element exerting a press-on force on the first end of the connecting lug. By way of example, the press-on force between the press-on element and the first end of the connecting lug can be in the range of 1 N to 120 N (Newton).

In order to produce such a power semiconductor module, the housing element and the connecting lug are provided, wherein the foot region of the connecting lug is bent over relative to the shaft thereof by a predefined initial bending angle of more than 0°. The initial bending angle can be, for example, more than 60° and/or less than 80°. The housing element has an insertion channel, into which the connecting lug is inserted in an insertion direction with the foot region ahead until the underside of the foot region bears against the housing element. By inserting the connecting lug further into the insertion channel, the foot region is bent over relative to the shaft in a manner increasing the bending angle until the bending angle has reached a predefined end value.

The housing element pre-equipped with a connecting lug in this way can be processed further to form a power semiconductor module. For this purpose, provision is made of a bonding wire, and also a circuit carrier equipped with a power semiconductor chip and including an insulating ceramic layer, which is provided with an upper metallization, on which a power semiconductor chip is arranged. The bonding wire is bonded firstly to the topside of the foot region, secondly to an upper metallization and/or to that side of the power semiconductor chip which faces away from the upper metallization.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The detailed description below refers to the accompanying drawings, which form part of the description and which, on the basis of concrete configurations, elucidate the manner in which the invention can be realized. Directional indications in this regard such as e.g. "at the top", "at the bottom", "at the front", "at the back", "front", "rear", etc., are used with respect to the orientation of the figures explained. Since the elements in the configurations can be arranged in a large number of different orientations, the direction-linked terminology serves merely for clear elucidation and should in no way be understood as restrictive. It is pointed out that the present invention can also encompass other configurations. Furthermore, it is pointed out that the features of the different exemplary configurations described below can be combined with one another unless expressly mentioned to the contrary, or unless the combination of specific features is impossible for technical reasons.

Figure 1:
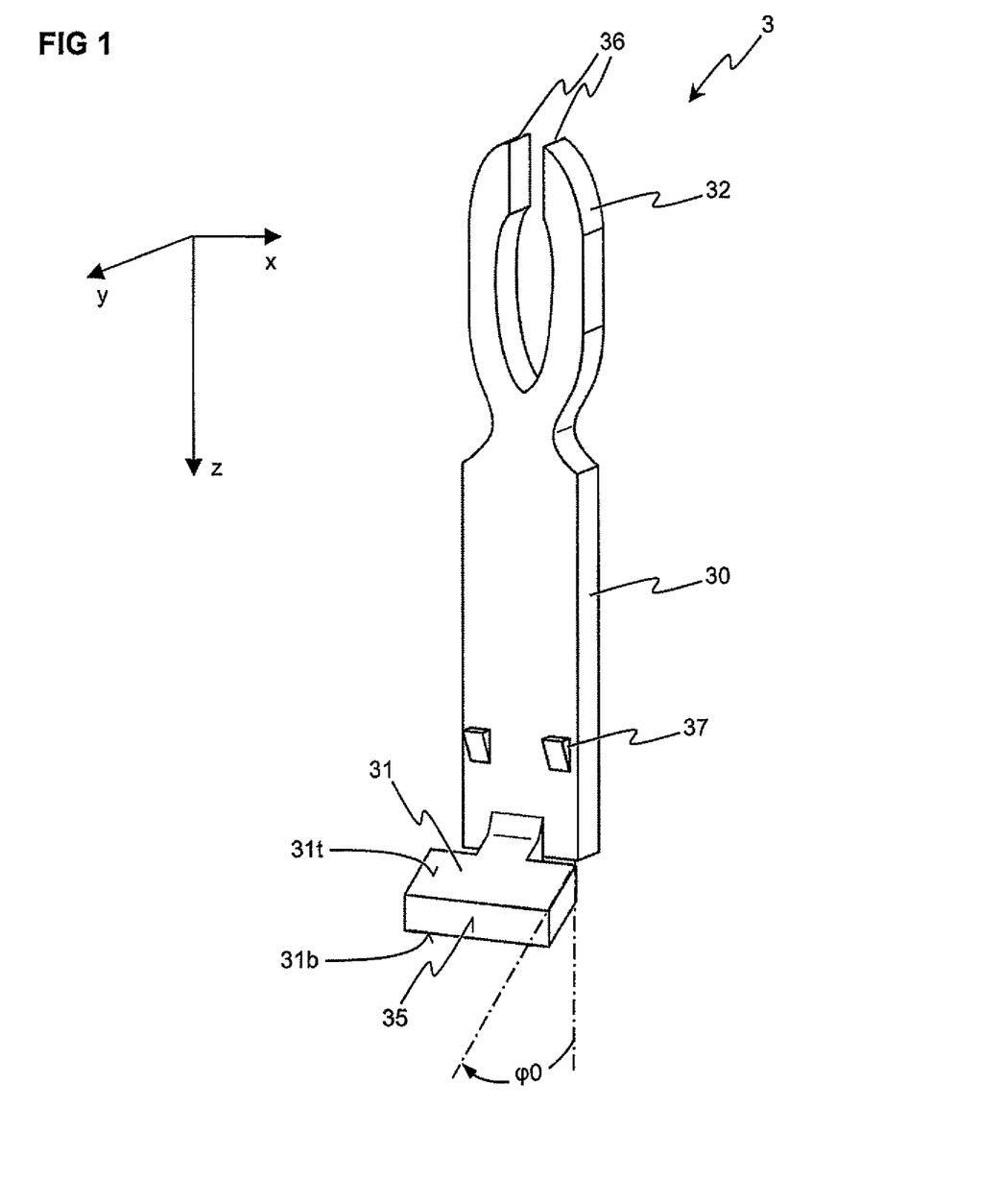
FIG. 1 shows a perspective view of a connecting lug not yet inserted into a housing element, and including a foot region bent over relative to a shaft by a predefined initial bending angle.

FIG. 1 shows a perspective view of a connecting lug 3 such as can be used, for example, for making electrical contact with a power semiconductor module. The connecting lug 3 includes an elongated shaft 30, which extends in a longitudinal direction z. The connecting lug 3 has a first end 35 and a second end 36. A foot region 31 is arranged between the first end 35 and the shaft 30, the foot region 31 being bent over relative to the shaft 30 by a predefined initial bending angle $\phi 0$. The foot region 31 has an underside 31b and also a topside 31t facing away from the underside 31b. The topside 31t is embodied as a substantially planar area and is thereby suitable for bonding one or a plurality of bonding wires thereon. The predefined initial bending angle $\phi 0$ is greater than 0°, for example greater than or equal to 60°, and/or less than or equal to 80°.

An electrical contact location 32 is situated between the shaft 30 and the second end 36 of the connecting lug 3, the electrical contact location 32 serving for externally making electrical contact with a power semiconductor module with which the connecting lug 3 is used. In the exemplary embodiment shown, the connecting contact 32 is embodied as a press-fit contact, for example. The press-fit contact 32 is forked and has two arms which, in order to produce an electrically conductive connection to a module-external component, can be introduced into an electrical contact opening of the component and thereby be electrically conductively connected thereto. In other configurations of a connecting lug 3, the connecting contact 32 can have any other configurations desired. Soldering contacts, screw contacts or spring contacts are mentioned merely by way of example. The configuration of the connecting contact 32 can be chosen independently of the configuration of the shaft 30 and of the foot region 31.

Furthermore, the shaft 30 of the connecting lug 3 can optionally be provided with one or a plurality of latching tabs 37, which can be produced by an embossing die, for example, which acts on the rear side of the shaft 30 facing away from the latching tabs 37, such that material protrusions that form the latching tabs 37 arise on the front side of the shaft 30. Such latching tabs 37 serve for interlocking the connecting lug 3, when the latter is inserted into a housing element, with the housing element.

The connecting lug 3 is formed from a material having good electrical conductivity, for example copper or a copper alloy having a high proportion of copper, in order to keep the electrical losses low when the connecting lug 3 is energized.

The connecting lug 3 can be embodied in an integral fashion, as shown, or alternatively comprise two or more parts connected to one another.

The connecting lug 3 can be produced, for example, by a stamped part firstly being stamped from a flat sheet, the stamped part being processed further to form the connecting lug 3. For this purpose, the later foot region 31 is bent over relative to the later shaft 30 by a predefined initial bending angle $\phi 0$. If one or a plurality of latching tabs 37 are provided, the latter are produced by an embossing die as explained. Further production steps such as, for example, the application of an electrolytic coating in order to improve the bondability and/or in order to improve the solderability, rounding or beveling of edges, the drilling or stamping of a screw-on opening or the cutting of a connecting thread can likewise be performed on the connecting lug 3 that has not yet been inserted into a housing element.

Figure 2:
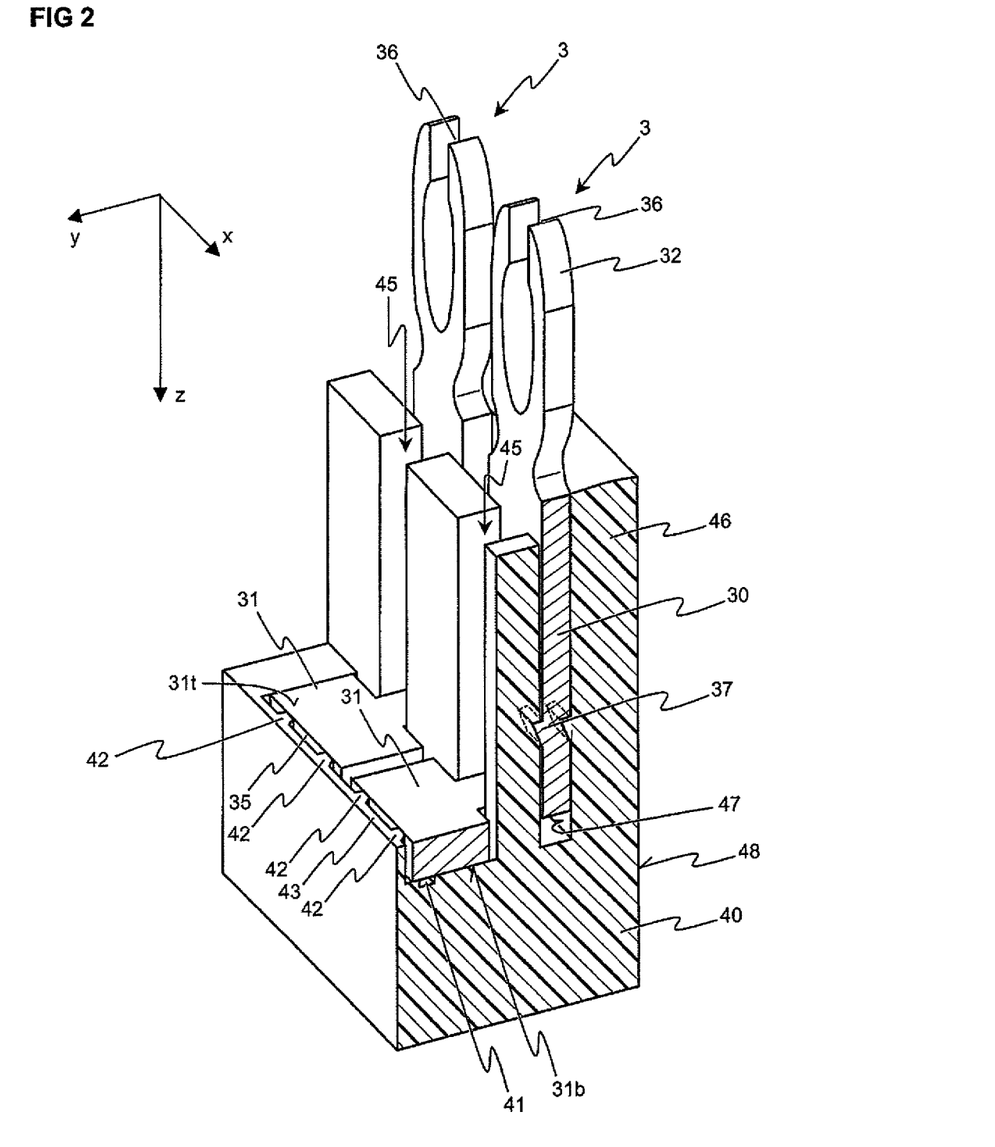
FIG. 2 shows a perspective sectional view through a portion of a housing frame for a power semiconductor module in which two connecting lugs embodied in accordance with FIG. 1 have been inserted.

FIG. 2 shows a perspective view of a portion of a housing element 40, which can be electrically insulating. The housing element 40 can be an injection molded, for example. Two connecting lugs 3 are inserted into the housing element 40. For this purpose, the connecting lugs 3, each embodied in accordance with FIG. 1, are inserted by the foot region 31 into a respective insertion channel 45 formed on the housing element 40 until the underside 31b of the foot region 31 bears against the housing element 40. Afterward, the connecting lugs 3 are inserted further into the respective insertion channels 45 in the original insertion direction z, which is the same as the longitudinal direction z of the shaft 30, such that the foot region 31 is bent over relative to the shaft 30 in a manner increasing the bending angle φ0 until the bending angle reaches a predefined end value of approximately 90°.

During the process of inserting the connecting lugs 3 further into the respective insertion channels 45, the first ends 35 of the connecting lugs 3, which simultaneously constitute the ends of the foot regions 31, are pressed against press-on elements 42 embodied as projections on a common web 43, or alternatively as projections on a respective separate web of the housing element 40. In this case, the press-on elements 42 are deformed during the press-fit operation. The connecting lug 3 is thereby braced between the press-on elements 42 and a side 47 of the housing wall 46 facing the module interior, such that the foot regions 31 assume a well-defined position and are sufficiently fixed for a later bonding operation.

If the connecting elements 3 are provided with optional latching tabs 37, the latching tabs 37 interlock with the material of the housing element 40 during the insertion operation and are thereby stabilized in the housing element 40.

Below the undersides 31b of the foot regions 31, the housing element 40 has a depression 41, the significance of is described later herein.

The press-on elements 42 can be embodied, for example, as tabs or projections on that side of the common web 43 which faces the shafts 30. The positions and the widths of the press-on elements 42 are chosen such that the ends 35 of the connecting lugs 3 make contact with the housing element 40 only in portions, but not over the entire area of the end 35.

Figure 3A:
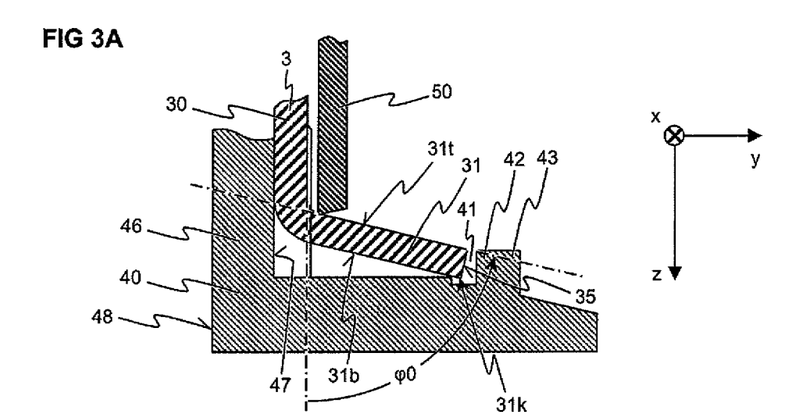
FIGS. 3A-3C show different steps in the process of inserting a connecting lug in accordance with FIG. 1 into a housing frame in order to produce an arrangement in accordance with FIG. 2.

The various phases during the insertion of a connecting lug 3 into a module an insertion channel 45 are explained below with reference to FIGS. 3A to 3C. FIG. 3A shows a vertical section through a portion of a housing element 40 having an insertion channel 45, into which a connecting lug 3 is inserted with the aid of a die 50. For this purpose, the die 50 presses onto the topside 31t of the foot region 31 of the connecting lug 3. The first phase of insertion ends at the point in time at which the underside 31b of the foot region 31 touches the housing element 40. This situation is illustrated in FIG. 3A. In this phase, the foot region 31 is still bent over by the initial bending angle φ0. The distance in the direction y between the first end 35 and the press-on element 42 can be 0.2 mm to 1.0 mm, for example, in this phase.

In order to prevent the edge 31k formed between the underside 31b and the first end 35 of the connecting lug 3 from removing chips from the housing element 40, a depression 41 is provided in the housing element 40. The depression 41 is arranged such that the first end 35 is arranged into the depression 41 at the point in time at which the underside 31b of the foot region 31 touches the housing element 40 for the first time during the insertion of the connecting lug 3 into the insertion channel 45.

In the process of inserting the connecting lug 3 further into the insertion channel 45, the foot region 31 is bent over further relative to the shaft 30 in a manner increasing the initial bending angle φ0 until the end 35 of the foot region 31 touches the press-on element or elements 42 assigned to the connecting lug 3. This situation is illustrated in FIG. 3B.

In the process of inserting the connecting lug 3 even further into the insertion channel 45, the end 35 of the foot region 31 partly displaces the material of the press-on element or elements 42, such that the connecting lug 3 is clamped between the press-on element or elements 42 assigned to it and the side 47 of the side wall 46 of the housing element 40, the side 47 facing the module interior, and is thereby situated in an unambiguously defined position with respect to the housing element 40. FIG. 3C shows the arrangement with the connecting lug 3 fully inserted. In this state, the bending angle φ between the shaft 30 and the foot region 31 reaches its predefined end value φ1, which is defined, in particular, by the geometry of the housing element 40. As is shown in the present example, the predefined end value φ1 of the bending angle φ can be approximately 90°, for example.

Figure 3B:
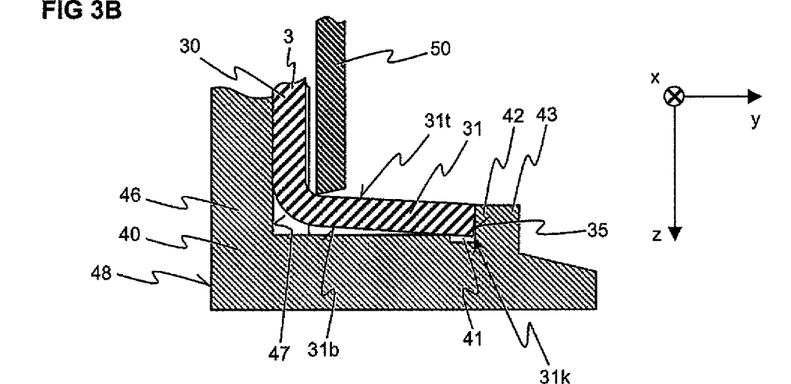
Figure 3C:
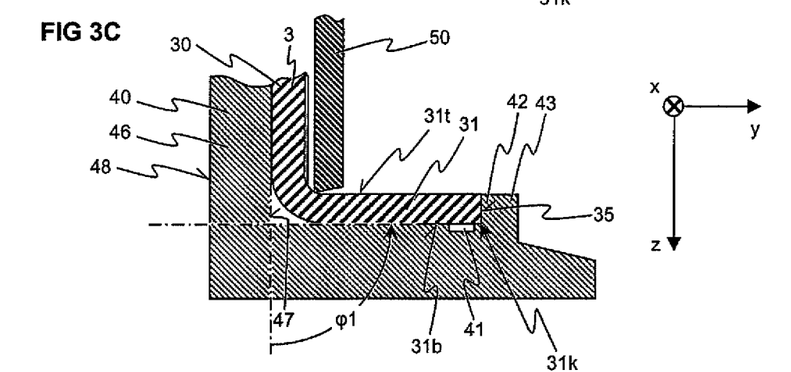
Figure 3D:
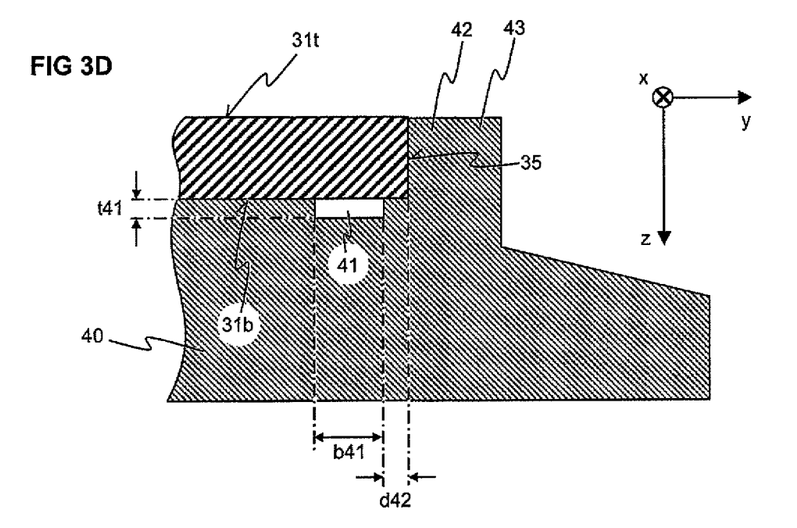
FIG. 3D shows an enlarged excerpt from the arrangement in accordance with FIG. 3C.

FIG. 3D shows an enlarged portion of the arrangement in accordance with FIG. 3C. This view reveals that the underside 31b of the foot region 31 completely covers the depression 41 at least in a direction y. The depression 41 has a depth t41, which can be e.g., 0.1 mm to 0.5 mm. The width b41 of the depression 41, measured in a direction y which lies in the plane of the bending angle φ and which runs perpendicularly to the longitudinal direction z of the shaft 30, can be 0.5 mm to 2 mm, for example, but values above or below this range are likewise possible. The displacement d42, produced during the insertion of the connecting lug 3, of the material of the press-on element 42 in the direction y is greater than 0 mm. Optionally, the displacement d42 can additionally be less than or equal to 1.0 mm.

Figure 4:
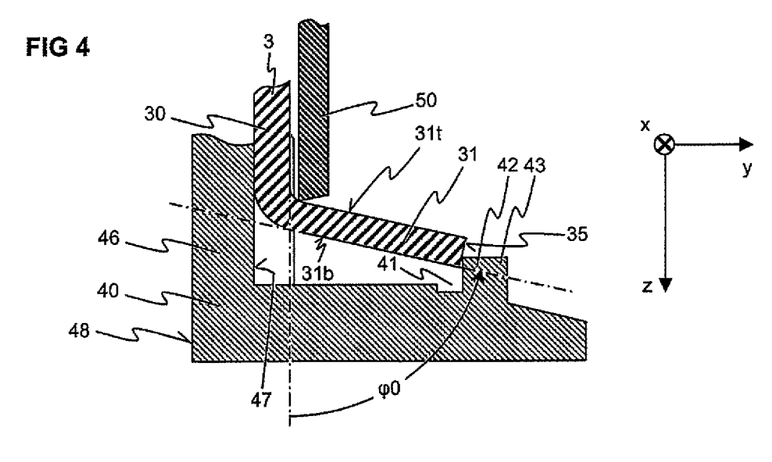
FIG. 4 shows a phase of an alternative method wherein the displacement of the material of a stop element begins before the underside of the foot region makes contact with the housing element.

FIG. 4 shows an alternative embodiment to the method outlined with reference to FIGS. 3A to 3C. The foot region 31 can also project beyond the press-on element 42 during the insertion of the connecting lug 3 into the relevant insertion channel 45 in the direction y, for example by more than 0 mm to 0.2 mm. In this case, the displacement of the material of the press-on element 42 by the foot region 31 already begins before the first touch between the underside 31b of the foot region 31 and the housing 40. The process of inserting the connecting lug 3 further into the insertion channel 45 and the process of bending over the foot region 31 further relative to the elongate shaft 30 are affected in accordance with the methods explained with reference to FIGS. 3B and 3C.

Figure 5:
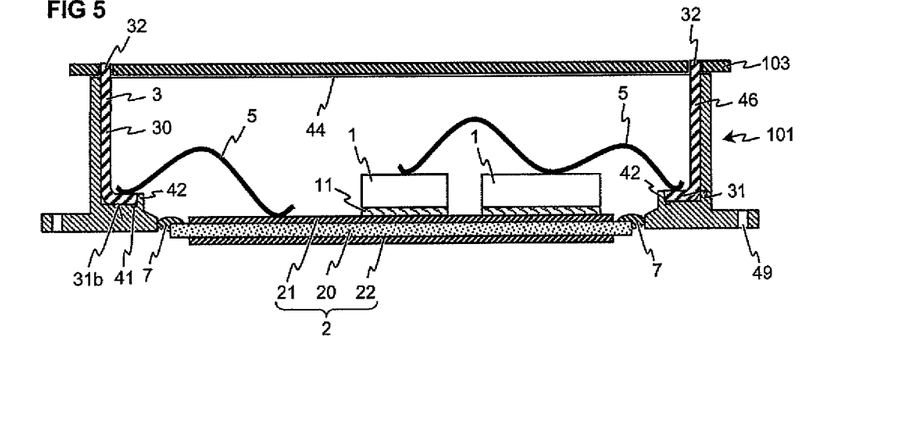
FIG. 5 shows a vertical section through a baseplate-free power semiconductor module including a housing frame equipped with connecting lugs, wherein those ends of the connecting lugs which project from the module housing are press-fitted into a control circuit board.

FIG. 5 shows a vertical section through a so-called baseplate-free power semiconductor module 101, onto which a printed circuit board 103 is placed.

The power semiconductor module 101 has a housing element 40, into which, as explained above with reference to FIGS. 1 to 4, connecting lugs 3 are inserted. The housing element 40 is embodied as a closed ring, by way of example. The form of the housing element 40 corresponds to that of the housing element shown in FIGS. 3A to 3C and 4, although flanges having mounting openings 49 are also provided, which serve for screwing the power semiconductor module 101 to a heat sink (not shown in FIG. 5).

The upper opening of the ring is covered by an optional housing cover 44, through which the electrical contact locations 32 are led. As alternative thereto, the housing cover 44 can also be situated laterally alongside the contact locations 32. In other configurations, a housing cover 44 can be completely dispensed with, for example if a stable potting compound is filled into the module interior.

The electrical contact locations 32 are embodied as press-fit contacts, for example, which are inserted into corresponding contact holes in the printed circuit board 103. Control electronics (not illustrated) for driving the power semiconductor module 101 are realized on the printed circuit board.

A circuit carrier 2 is inserted into the lower opening of the ring, the circuit carrier 2 including a dielectric insulation carrier 20 with an upper metallization 21 structured to form conductor tracks and with an optional lower metallization 22.

The metallizations 21 and 22 are fixedly connected to the topside and to the underside, respectively, of the insulation carrier 20. The insulation carrier 20 can be a flat ceramic lamina, for example. Examples of suitable ceramic materials therefore include aluminum nitride (AlN), aluminum oxide, ($Al_2O_3$), silicon nitride ($Si_3N_4$), silicon carbide (SiC), or beryllium oxide (BeO). The metallizations 21 and 22 can be of copper or of a copper alloy having a high proportion of copper. The circuit carrier 2 can be, for example, a DCB substrate (DCB=Direct Copper Bonding) or a DAB substrate (DAB=Direct Aluminum Bonding) or an AMB substrate (AMB=Active Metal Brazing).

One or a plurality of power semiconductor chips, for example IGBTs (insulated gate bipolar transistors), MOSFETs (metal oxide semiconductor field effect transistors), thyristors, diodes, etc., are arranged on the upper metallization 21 and electrically conductively connected to the upper metallization 21. The structuring of the upper metallization 21 can be chosen as desired depending on the circuit to be realized. The electrically conductive connection between lower contact areas of the power semiconductor chips 1 and the upper metallization 21 can be effected for example by a connection layer 11 by soldering, diffusion soldering, electrically conductive adhesive bonding or low-temperature pressure sintering.

As an alternative to the configuration shown, instead of only one circuit carrier 2, it is also possible for two or more circuit carriers 2 constructed in the manner explained to be provided alongside one another in the region of the lower opening.

Since the power semiconductor module 101 explained with reference to FIG. 5 is a so-called "baseplate-free module", the circuit carrier 2 is not fixedly connected to a solid baseplate forming the baseplate of the power semiconductor module 101, but rather is adhesively bonded into the lower opening of the housing element 40 by an elastic adhesive 7, such that all gaps between the housing element 40 and the circuit carrier 2 are sealed by the adhesive 7. On account of the elasticity of the adhesive 7, the circuit carrier 2 is movable relative to the housing element 40 to a certain degree. If the power semiconductor module 101, for example with the aid of mounting openings 49 integrally formed on the housing element 40, is screwed against a planar contact area of a heat sink (not illustrated), then the circuit carrier 2 is pressed against the contact area, such that a good thermal contact arises between the circuit carrier 2 or the circuit carriers 2 and the contact area. The mounting of one or a plurality of circuit carriers 2 on the housing element 40 using an elastic adhesive 7 can be affected, for example, in accordance with all the variants explained in U.S. patent application Ser. No. 12/789, 251 of May 27, 2010.

In order to connect the circuit realized on the circuit carrier 2 to the connecting lugs 3, bonding wires 5 are provided, which are bonded firstly onto the topside 31t of the foot region 31, and secondly onto the upper metallization 21 and/or onto that side of a power semiconductor chip 1 which faces away from the upper metallization 21. In this case, the term bonding wire 5 is understood to mean both wires which have a circular cross section outside the bonding locations, and flat ribbons having a substantially rectangular cross section. In principle, suitable bonding wires 5 include wires composed of metal, for example copper, or composed of any copper alloy, e.g. a copper alloy having a proportion of at least 99% by weight copper, or composed of aluminum, or composed of any desired aluminum alloy, for example an aluminum alloy having a proportion of at least 99.99% by weight aluminum, or an aluminum alloy having a proportion of at least 0.1% by weight magnesium. In principle, the bonding wires 5 can have any desired cross-sectional areas. The advantage of the arrangement increases as the cross-sectional area increases. The latter can be chosen to be, for example, greater than or equal to 30 000 $\mu m^2$ (corresponds approximately to a bonding wire diameter of 200 µm), or greater than or equal to 70 000 $\mu m^2$ (corresponds approximately to a bonding wire diameter of 300 µm). The bonding connection can be produced by ultrasonic bonding, for example.

Optionally, the module interior can at least partly be filled with a soft potting compound, for example a silicone gel, in order to increase the insulation strength of the module.

Figure 6:
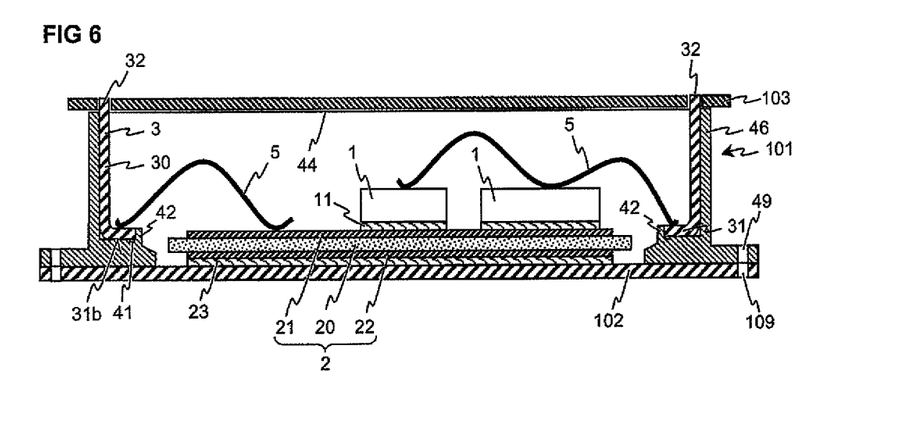
FIG. 6 shows a vertical section through a power semiconductor module including a baseplate having a housing frame equipped with connecting lugs, wherein those ends of the connecting lugs which project from the module housing are press-fitted into a control circuit board.

The power semiconductor module shown in FIG. 6 differs from the power semiconductor module in accordance with FIG. 5 in that the circuit carrier 2, in contrast to the circuit carrier 2 in accordance with FIG. 5, is not adhesively bonded into the lower opening of the housing element 40. Instead, a solid metallic baseplate 102 is provided, to which the bottommost metallization 22 of the circuit carrier 2 is fixedly connected with the aid of a connection layer 23. The connection layer 23 can be produced for example by soldering, diffusion soldering, electrically conductive adhesive bonding or low-temperature pressure sintering. The thickness of the baseplate 102 is at least 1 mm to 5 mm, for example.

The baseplate 102 additionally has mounting openings 109, corresponding to the mounting openings 49 on the housing element 40, in order to enable the power semiconductor module 101 to be screwed to a heat sink (not shown in FIG. 6).

Figure 7:
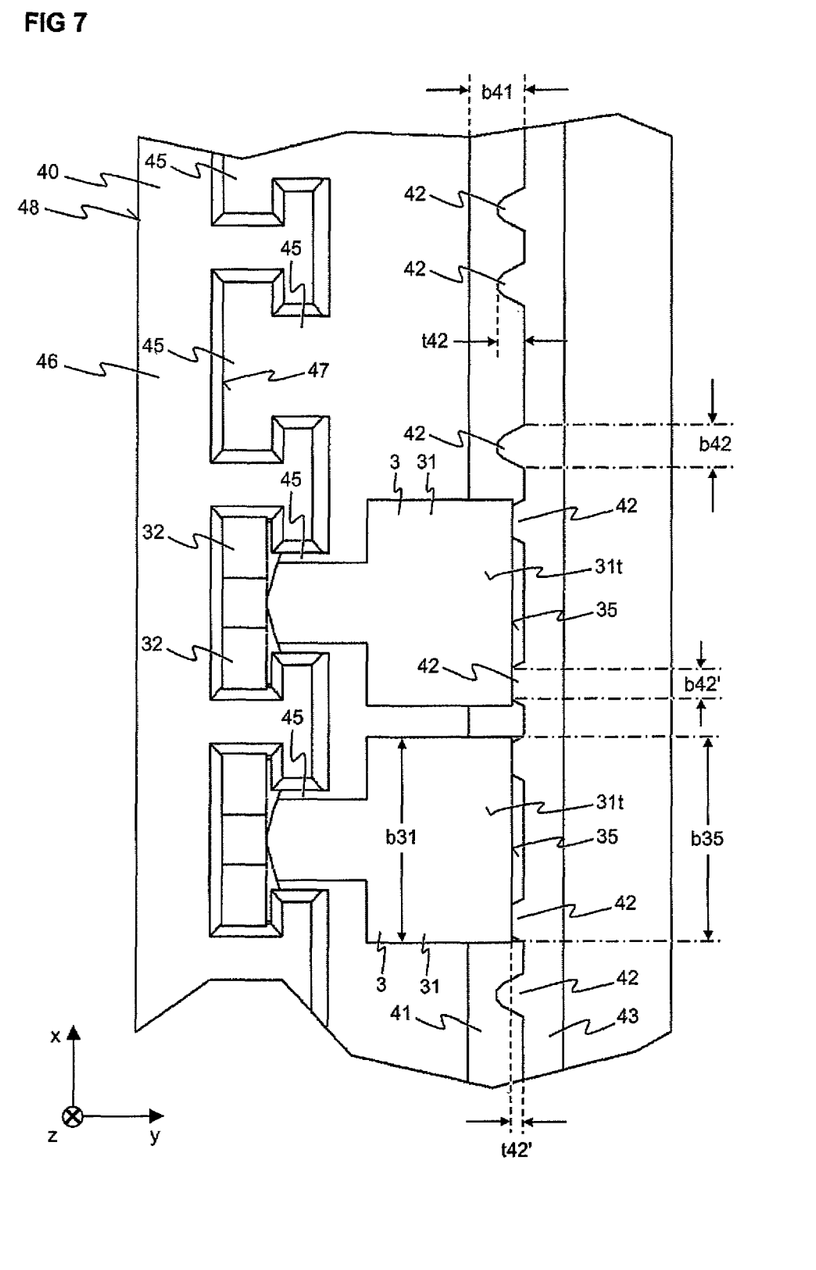
FIG. 7 shows a plan view of a housing element of a power semiconductor module into which two connecting lugs are inserted.

FIG. 7 shows a plan view of a portion of a housing element 40 having a plurality of insertion channels 45. A respective connecting element 3 is inserted into two of the insertion channels 45 in accordance with the method explained above. This plan view clearly reveals the press-on elements 42 embodied as projections of a web 43.

Situated opposite the insertion channel 45 not equipped with a connecting lug, at the top in FIG. 7, are press-on elements 42 which, for example, are embodied as projections of a common web 43 and which are situated on that side of the web 43 which faces the insertion channel 45. Since no connecting lug 3 has yet been inserted into the associated insertion channel 45, these press-on elements 42, relative to the web 43, still have their original depth t42, which is 0.5 mm in the example shown. In principle, any other values can be chosen, for example 0.3 mm to 1 mm.

After a connecting lug 3 has been fully inserted into an insertion channel 45, as is shown by way of example on the basis of the two lower insertion channels 45 in FIG. 7, the material of the press-on elements 42 is partly displaced by the first end 35 of the connecting lug 3, such that the original depth t42 of the press-on element 42 is reduced to a depth t42'. In the example shown, the reduced depth t42' is 0.2 mm. This results in a material displacement of approximately 0.3 mm. The reduced depth t42' is dependent, in particular, on the initial bending angle φ0 and the predefined end value φ1 of the bending angle φ. The depth t42' can lie in the range of 0.1 mm to 0.9 mm, for example. In any event, the reduced depth t42' is less than the original depth t42. As a result of the compression of the press-on element or elements 42, the foot region 31 is clamped between the relevant press-on elements 42 and the outer wall 48 of the housing element 40 and thus held in a precisely defined position.

This view likewise reveals that the foot region 31, in the direction y, completely covers the depression 41 in the region of the press-on elements 42. The arrangement is configured such that the first end 35 of each connecting lug 3 only partly touches the housing element 40, that is to say that each of the first ends 35 has regions in which it is spaced apart from the web 43 and thus from the housing element 40. The maximum widths b42 of the press-on elements 42 can be chosen such that they are less than the width b35 of the first ends 35 of the foot regions 31. In this case, the widths b42 and b35 are determined in a direction x running perpendicularly to the plane spanned by the bending angle φ. In the exemplary embodiment shown, the width b42 is 0.7 mm. In principle, other values, for example 0.3 mm to 2 mm, are also possible.

Figure 8:
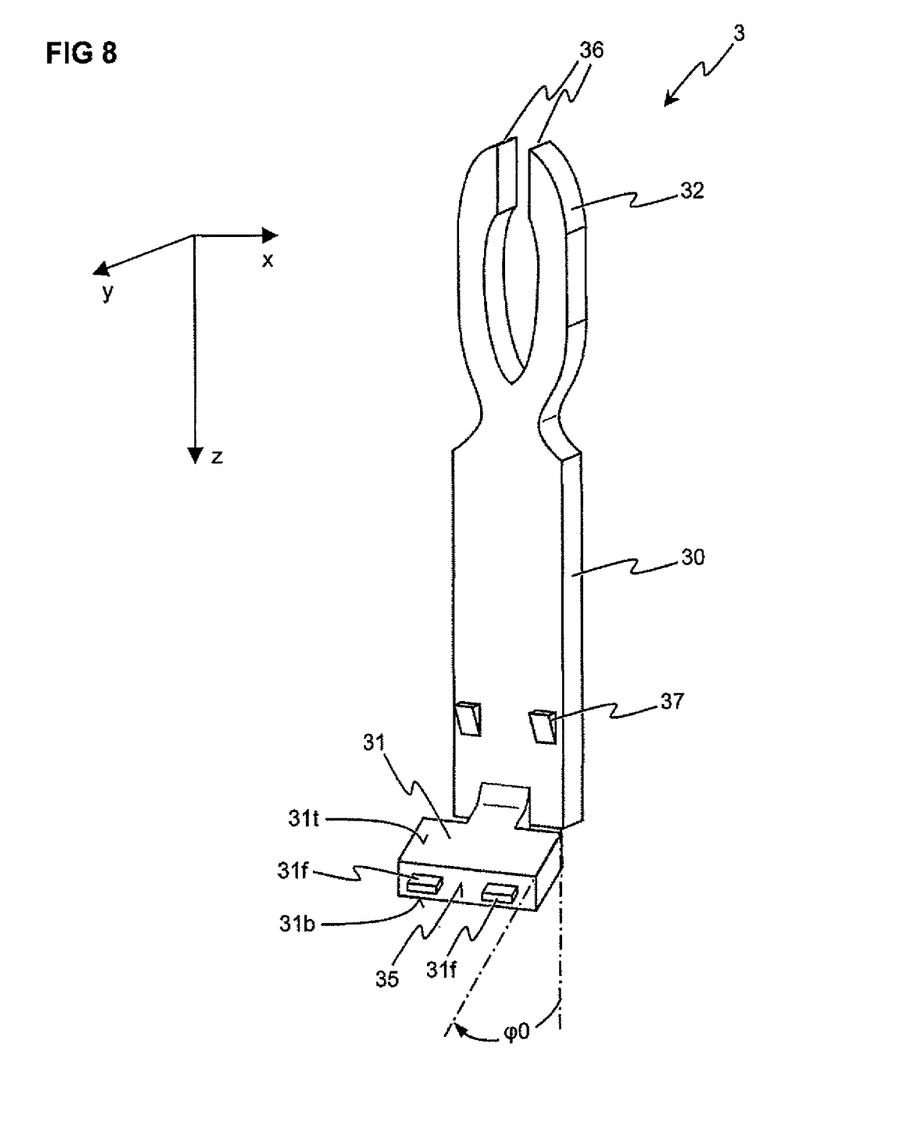
FIG. 8 shows a configuration of a connecting lug wherein the first end is provided with extensions.
Figure 9:
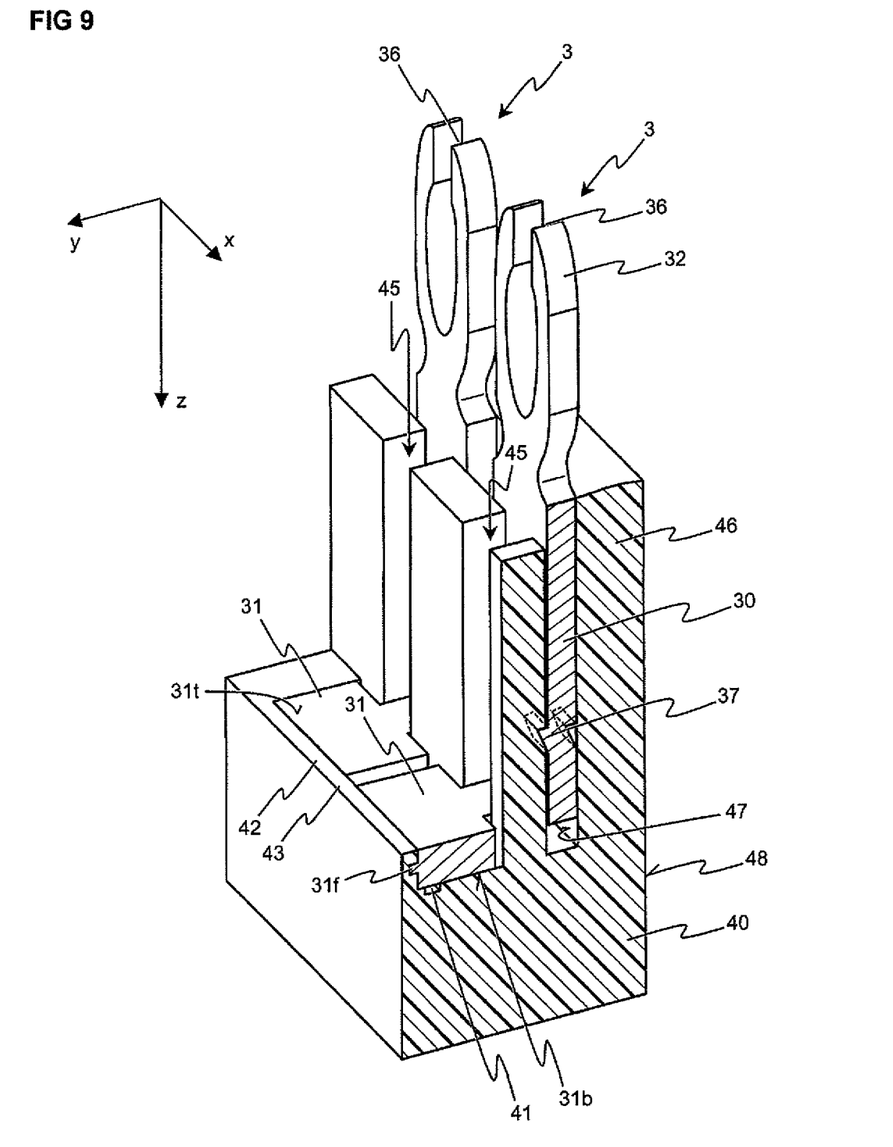
FIG. 9 shows an arrangement comprising two connecting lugs embodied in accordance with FIG. 8 that have been completely inserted into a housing element.

FIG. 8 shows a connecting lug 3 that differs from the connecting lug 3 shown in FIG. 1 in that two extensions 31f are arranged on the first end 35 of the foot region 31, the extensions 31f penetrating into the stop element 42 when the connecting lug 3 is fully inserted into an insertion channel 45, as illustrated in FIG. 9. As a result, the connecting lug 3 is clamped between the stop element 42, which is embodied here for example as a web 43 of the housing element 40, and the side 47 of the housing side wall 46, the side 47 facing the module interior, and is thereby sufficiently fixed for a subsequent bonding operation. Instead of being provided with exactly two extensions 31f, the first end 35 of the foot region 31 can correspondingly also be provided with only one extension 31f or else with more than two extensions 31f.

Figures 10A, 10B:
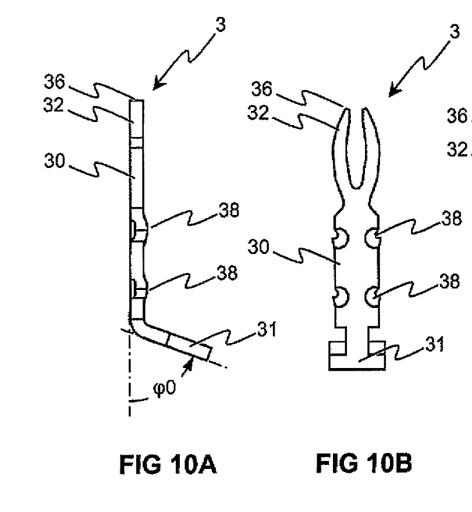
FIGS. 10A-10C show different views of another connecting lug, the foot region of which is bent over relative to the shaft by a predefined initial bending angle.
Figure 10C:
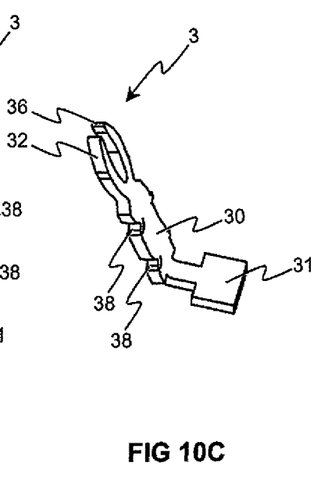

FIGS. 10A to 10C show various views of a further exemplary embodiment of a connecting lug 3. This connecting lug 3 can be inserted into a housing element 40 in the same way as the connecting lug 3 shown in FIGS. 1 and 8. It differs from the connecting lugs 3 shown in FIG. 1 in that it is not provided with latching tabs 37, but rather with local elevations 38 formed on the shaft 30 on that side thereof which faces the module interior. The elevations 38 can be produced by embossing in the same way as latching tabs 37. The elevations 38 form springs by which the shaft 30 is clamped with the housing element 40 during the insertion of the connecting lug 3 into an insertion channel 45. FIG. 10A shows a side view, FIG. 10B a rear view and FIG. 10C a perspective view of the connecting lug 3.

Figure 11A:
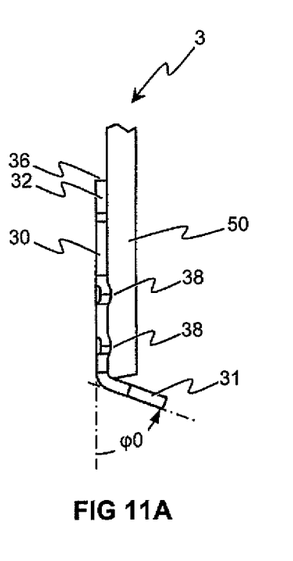
FIG. 11A shows the connecting lug shown in FIG. 10a with a die for press-fitting the connecting lug into an insertion channel with the aid of a housing element for a power semiconductor module.

FIG. 11A shows the connecting lug 3 illustrated in FIG. 10A together with a die 50. The die 50 serves for press-fitting the connecting lug 3 into an insertion channel 45 of a housing element 40. During the press-fit operation, the die 50 assumes the position shown in FIG. 11A relative to the connecting lug 3.

Figure 11B:
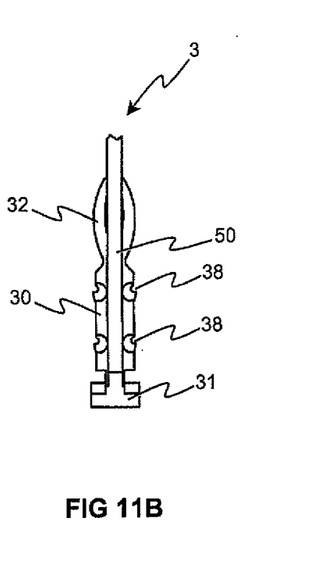
FIG. 11B shows a side view of the arrangement in accordance with FIG. 10A, looking at the end of the foot region.

FIG. 11B shows the arrangement in accordance with FIG. 11A, looking at the first end 35 of the connecting lug 3.

In principle, the above-explained concept of bending over the foot region 31 of a connecting lug 3 relative to an elongated shaft 30 of the connecting lug 3 during insertion of the connecting lug 3 into an insertion channel 45 is independent of whether and, if appropriate, by what structural measures such as, for example, the latching tabs 37 shown in FIGS. 1, 2, 8 and 9 or the elevations 38 shown in FIGS. 10A, 10B, 10C, 11A and 11B the elongated shaft 30 is fixed in the insertion channel 45.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
a housing element having an insertion channel;
an electrically conductive connecting lug inserted into the insertion channel and comprising an elongated shaft and a foot region having an underside and a topside facing away from the underside, the foot region extending as far as a first end of the connecting lug, the first end facing an interior of the module, the foot region being bent over relative to the shaft by a predefined bending angle; and
wherein the housing element has at least one press on element contacting the first end of the connecting lug, and the foot region is secured in the housing element by a force exerted on the first end of the connecting lug by each press on element contacting the first end of the connecting lug.

2. The power semiconductor module as claimed in claim 1, wherein the foot region is assigned exactly one press on element, exactly two press on elements spaced apart from one another or more than two press on elements spaced apart from one another.

3. The power semiconductor module as claimed in claim 1, wherein the housing includes a common web, and wherein exactly one, more or each press on element assigned to the connecting lug is a projection extending from the common web.

4. The power semiconductor module as claimed in claim 1, wherein exactly one, more or each press on element assigned to the connecting lug exerts a force of 1 N to 120 N on the first end of the connecting lug.

5. The power semiconductor module as claimed in claim 1, wherein exactly one, more or each press on element assigned to the connecting lug has a width where it touches the first end of the connecting lug which is less than a width of the foot region at the first end.

6. The power semiconductor module as claimed in claim 1, wherein the first end of the connecting lug has exactly one, exactly two or more than two extensions each of which penetrates into the at least one press on element assigned to the connecting lug.

7. The power semiconductor module as claimed in claim 1, wherein the underside of the foot region completely covers a depression in the housing element.

8. The power semiconductor module as claimed in claim 1, wherein material of the at least one press on element is partly displaced by the first end of the connecting lug.

* * * * *